(12) United States Patent
Tanaka et al.

(10) Patent No.: US 9,989,720 B2
(45) Date of Patent: Jun. 5, 2018

(54) OPTO-ELECTRIC HYBRID BOARD

(71) Applicant: NITTO DENKO CORPORATION, Ibaraki-shi, Osaka (JP)

(72) Inventors: Naoyuki Tanaka, Osaka (JP); Yuichi Tsujita, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days. days.

(21) Appl. No.: 15/520,509

(22) PCT Filed: Oct. 14, 2015

(86) PCT No.: PCT/JP2015/078975
§ 371 (c)(1),
(2) Date: Apr. 20, 2017

(87) PCT Pub. No.: WO2016/067914
PCT Pub. Date: May 6, 2016

(65) Prior Publication Data
US 2017/0315316 A1    Nov. 2, 2017

(30) Foreign Application Priority Data

Oct. 28, 2014    (JP) ................. 2014-219301

(51) Int. Cl.
*G02B 6/42*    (2006.01)
*H05K 1/02*    (2006.01)
(Continued)

(52) U.S. Cl.
CPC ........... *G02B 6/4281* (2013.01); *G02B 6/122* (2013.01); *G02B 6/4283* (2013.01); *H05K 1/028* (2013.01);
(Continued)

(58) Field of Classification Search
CPC ................. G02B 6/4281; G02B 6/4283
See application file for complete search history.

(56) References Cited

U.S. PATENT DOCUMENTS 6,868,214 B1    3/2005  Sakata et al.
7,050,691 B2    5/2006  Ishizaki et al.
(Continued)

FOREIGN PATENT DOCUMENTS

JP    2001-42150 A    2/2001
JP    2004-205661 A   7/2004
(Continued)

OTHER PUBLICATIONS

International Search Report dated Jan. 12, 2016, issued in counterpart of International Application No. PCT/JP2015/078975 (2 pages).
(Continued)

*Primary Examiner* — Omar R Rojas
(74) *Attorney, Agent, or Firm* — Westerman, Hattori, Daniels & Adrian, LLP

(57) ABSTRACT

An opto-electric hybrid board includes: an electric circuit board including an insulation layer having front and back surfaces, and electrical interconnect lines formed on the front surface of the insulation layer; and an optical waveguide having a substantially rectangular shape as seen in plan view and provided on the back surface of the insulation layer of the electric circuit board, with a metal layer therebetween. The optical waveguide has at least one end portion disposed in overlapping relation with the metal layer. The at least one end portion of the optical waveguide has corner portions. Each of the corner portions is radiused to have an arcuate shape or has a polygonal shape produced by arranging a plurality of obtuse-angled portions in a substantially arcuate configuration.

4 Claims, 6 Drawing Sheets

(51) Int. Cl.
*G02B 6/122* (2006.01)
*H05K 3/40* (2006.01)
*H05K 3/06* (2006.01)
*H05K 3/18* (2006.01)
*H05K 3/00* (2006.01)
*H05K 3/16* (2006.01)
*H05K 3/26* (2006.01)

(52) U.S. Cl.
CPC ........... *H05K 1/0274* (2013.01); *H05K 3/064* (2013.01); *H05K 3/188* (2013.01); *H05K 3/4007* (2013.01); *H05K 3/0023* (2013.01); *H05K 3/067* (2013.01); *H05K 3/16* (2013.01); *H05K 3/181* (2013.01); *H05K 3/26* (2013.01)

(56) References Cited

U.S. PATENT DOCUMENTS

| | | |
|---|---|---|
| 7,267,930 B2 | 9/2007 | Payne |
| 7,346,260 B2 | 3/2008 | Arakida et al. |
| 8,142,672 B2 | 3/2012 | Hodono |
| 8,577,189 B2 | 11/2013 | Yamada et al. |
| 9,046,646 B2 | 6/2015 | Tsujita et al. |
| 9,297,958 B2 | 3/2016 | Tsujita et al. |
| 2004/0234224 A1 | 11/2004 | Ishizaki et al. |
| 2005/0053330 A1 | 3/2005 | Arakida et al. |
| 2005/0271983 A1 | 12/2005 | Payne |
| 2007/0091640 A1* | 4/2007 | Kim ................... G02B 6/0016 362/612 |
| 2009/0261488 A1* | 10/2009 | Shimizu ................ G02B 6/125 264/1.29 |
| 2009/0269704 A1 | 10/2009 | Hodono |
| 2011/0292661 A1 | 12/2011 | Yamada et al. |
| 2013/0243371 A1 | 9/2013 | Tsujita et al. |
| 2014/0147076 A1 | 5/2014 | Tsujita et al. |

FOREIGN PATENT DOCUMENTS

| | | |
|---|---|---|
| JP | 2005-84227 A | 3/2005 |
| JP | 2008-502008 A | 1/2008 |
| JP | 2009-103927 A | 5/2009 |
| JP | 2009-258417 A | 11/2009 |
| JP | 2009-265342 A | 11/2009 |
| JP | 2010-134202 A | 6/2010 |
| JP | 2013-195532 A | 9/2013 |
| JP | 2014-106355 A | 6/2014 |
| WO | 2004/027472 A1 | 4/2004 |

OTHER PUBLICATIONS

Notification of Transmittal of Translation of the International Preliminary Report on Patentability (Form PCT/IB/338) issued in counterpart International Application No. PCT/JP2015/078975 dated May 11, 2017, with Forms PCT/IB/373 and PCT/ISA/237. (8 pages).

* cited by examiner

RELATED ART

OPTO-ELECTRIC HYBRID BOARD

TECHNICAL FIELD

The present disclosure relates to an opto-electric hybrid board including an electric circuit board and an optical waveguide which are stacked together.

BACKGROUND ART

With the increase in the amount of transmission information, optical interconnect lines in addition to electrical interconnect lines have been used in recent electronic devices and the like. A large number of opto-electric hybrid boards capable of transmitting electrical signals and optical signals at the same time have been used. As shown in FIG. 7, a known example of such opto-electric hybrid boards has a structure in which an electric circuit board E includes an insulation layer 1 made of polyimide and the like and serving as a substrate, and electrical interconnect lines 2 having an electrically conductive pattern and provided on the front surface of the insulation layer 1, and in which an optical waveguide W is provided on the back surface of the insulation layer 1, with a metal layer 9 for reinforcement provided therebetween (see PTL 1, for example). The front surface of the electric circuit board E is insulated and protected by a coverlay 3. The metal layer 9 is provided with through holes 5 and 5' for optical coupling between the optical waveguide W and an optical element (not shown) to be mounted on the front surface of the electric circuit board E. The optical waveguide W includes three layers: an under cladding layer 6; a core 7 serving as an optical path; and an over cladding layer 8.

There is a difference in coefficient of linear expansion between the insulation layer 1 and the optical waveguide W provided on the back surface thereof. If the insulation layer 1 and the optical waveguide W are directly stacked together, the difference in coefficient of linear expansion therebetween causes stresses and slight bending in the optical waveguide W due to ambient temperature, resulting in increased light propagation losses. The metal layer 9 is provided to avoid such increased light propagation losses. In accordance with trends toward a decrease in the size of electronic devices and an increase in the degree of integration thereof, the opto-electric hybrid boards have been often required to have flexibility in recent years for use in small spaces and in movable sections such as hinges. For the increase in flexibility of an opto-electric hybrid board in which the metal layer 9 is interposed for the provision of the optical waveguide W, it has been proposed to partially remove the metal layer 9 itself to cause the cladding layers of the optical waveguide W to enter the sites where the metal layer 9 is removed, thereby increasing the flexibility (see PTL 2, for example).

RELATED ART DOCUMENT

Patent Document

PTL 1: JP-A-2009-265342
PTL 2: JP-A-2013-195532

SUMMARY OF INVENTION

For a further increase in flexibility thereof, opto-electric hybrid boards in which the electric circuit board E has an increased width only in its opposite end portions serving as optical coupling portions or portions for connection to connectors and reinforced with metal layers 9 and 9' while having a decreased width in its intermediate portion have been often used in recent years, as shown in FIG. 8A which is a view of such an opto-electric hybrid board as seen from the optical waveguide W side.

Unfortunately, such an opto-electric hybrid board having a high degree of flexibility is often greatly pulled or twisted. This generates different stresses between the metal layers 9 and 9' and the optical waveguide W which are made of different materials. It has turned out that the difference in stresses is concentrated in corner portions P (portions enclosed within small circles in FIG. 8A) on opposite ends of the optical waveguide W to appear in the form of distortions or warpage, thereby resulting in a problem such that peeling off in these portions is prone to occur.

As shown in FIG. 8B, an opto-electric hybrid board of the type having no metal layers 9 and 9' is configured such that the opposite ends of the optical waveguide W are directly disposed on the back surface of the insulation layer 1 made of polyimide and the like. In such a case, the optical waveguide W and the insulation layer 1 are also made of different materials although the two types of resins are joined together. It has hence turned out that the optical waveguide W tends to peel off in the corner portions P thereof due to the difference in stresses.

In view of the foregoing, it is therefore an object to provide an opto-electric hybrid board which is used favorably over a prolonged period while preventing ends of an optical waveguide disposed in overlapping relation with a metal layer or an insulation layer on the back surface of an electric circuit board from peeling off the metal layer or the insulation layer.

To accomplish the aforementioned object, a first aspect of the present disclosure is intended for an opto-electric hybrid board comprising: an electric circuit board including an insulation layer, and an electrical interconnect line formed on a front surface of the insulation layer; and an optical waveguide, the optical waveguide having a substantially rectangular shape as seen in plan view and provided on a side of the electric circuit board opposite to the electric wiring, relative to the insulation layer having the electric wiring provided on the front surface thereof, directly or with a metal layer therebetween, the optical waveguide having at least one end portion disposed in overlapping relation with the insulation layer of the electric circuit board or the metal layer, and the at least one end portion of the optical waveguide having a corner portion, the corner portion being radiused to have an arcuate shape or having a polygonal shape produced by arranging a plurality of obtuse-angled portions in a substantially arcuate configuration.

In particular, a second aspect of the present disclosure is intended for the opto-electric hybrid board wherein the polygonal shape of the corner portion of the optical waveguide includes part of a regular polygon; wherein a radius of curvature of an arc circumscribed about the polygonal shape is in a range of 0.1 to 10.0 mm; and wherein a radius of curvature of the arcuate shape of the radiused corner portion is in a range of 0.1 to 10.0 mm.

In the opto-electric hybrid board, the corner portion provided in the at least one end portion of the optical waveguide disposed in overlapping relation with the metal layer or the insulation layer on the back surface of the electric circuit board is formed in a predetermined polygonal shape or an arcuate shape. If either the metal layer and the optical waveguide or the insulation layer and the optical waveguide differ from each other in internal stresses generated by external loads or heat in the laminate portion comprised of either the metal layer and the optical waveguide or the insulation layer and the optical waveguide, the aforementioned configuration prevents warpage and distortions based on the difference in stresses from being concentrated in the corner portion in the end portion of the optical waveguide to disperse such warpage and distortions along the outlines of the polygonal shape or the arcuate shape. Thus, the optical waveguide does not peel off in its end portions in the manufacturing steps including mounting an optical element and the like, in the step of incorporating the opto-electric hybrid board into an electronic device and during the actual use thereof. This allows the opto-electric hybrid board to be used favorably over a prolonged period.

In particular, in the opto-electric hybrid board, the polygonal shape of the corner portion of the optical waveguide includes part of a regular polygon; the radius of curvature of an arc circumscribed about the polygonal shape is in the range of 0.1 to 10.0 mm; and the radius of curvature of the arcuate shape of the radiused corner portion is in the range of 0.1 to 10.0 mm. This is preferable because the opto-electric hybrid board is especially excellent in the effect of preventing the optical waveguide from peeling off.

DESCRIPTION OF EMBODIMENTS

Next, embodiment s according to the present disclosure will now be described in detail with reference to the drawings. It should be noted that the present disclosure is not limited to the embodiments.

Figure 1A:
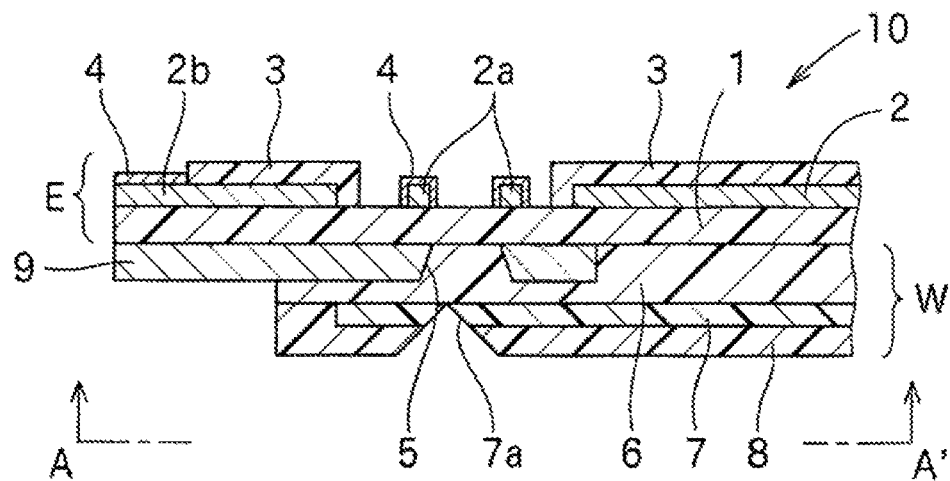
FIG. 1A is a schematic partial vertical sectional view of one embodiment of the present disclosure.
Figure 1B:
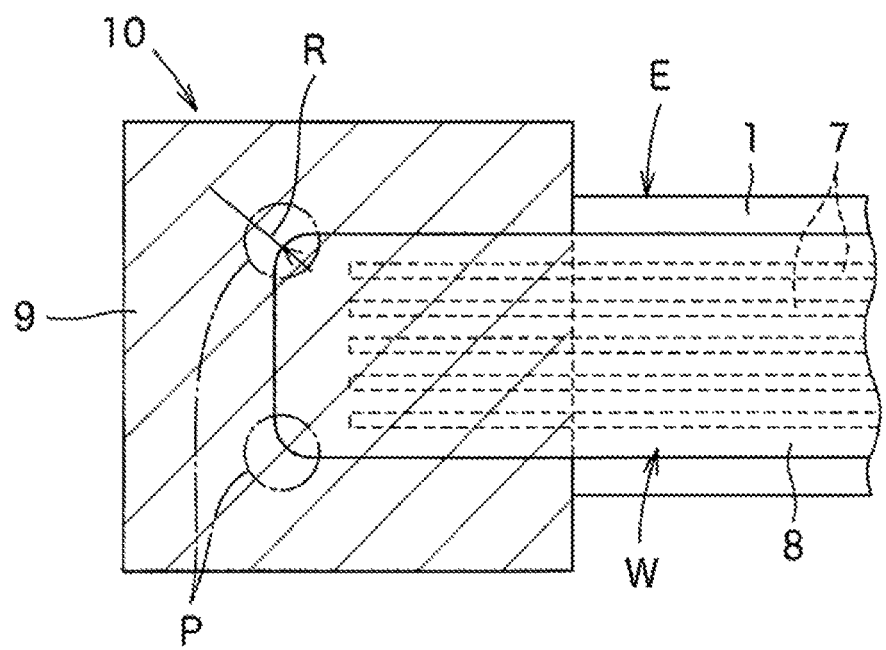
FIG. 1B is a view as seen in the direction of the arrows A-A' of FIG. 1A.

FIG. 1A is a schematic partial vertical sectional view of an opto-electric hybrid board according to one embodiment of the present disclosure, and FIG. 1B is a view as seen in the direction of the arrows A-A' of FIG. 1A. This opto-electric hybrid board 10 includes: an electric circuit board E including an insulation, layer 1 and electrical interconnect lines 2 provided on the front surface of the insulation layer 1; and an optical waveguide W provided on the back surface of the insulation layer 1.

In the electric circuit board E, the electrical interconnect lines 2 including optical element mounting pads 2a, a connector mounting pad 2b, other pads for mounting variable elements, grounding electrodes and the like (not shown) are formed on the front surface of the insulation layer 1 made of polyimide and the like. The electrical interconnect lines 2 except the pads 2a and the like are insulated and protected by a coverlay 3 made of polyimide and the like. The front surface of the pads 2a and the like not protected by the coverlay 3 is covered with an electroplated layer 4 made of gold, nickel and the like.

The optical waveguide W provided on the back surface of the insulation layer 1 has a substantially rectangular shape elongated in a horizontal direction as seen in plan view, and includes an under cladding layer 6, a core 7 formed in a predetermined pattern on the front surface (the lower surface as seen, in FIG. 1A) of the under cladding layer 6, and an over cladding layer 8 integral with the front surface of the under cladding layer 6 while covering the core 7.

A portion of the core 7 corresponding to the optical element mounting pads 2a of the electric circuit board E is in the form of an inclined surface at 45 degrees with respect to the direction in which the core 7 extends. The inclined surface serves as a light reflecting surface 7a. The light reflecting surface 7a functions to change the direction of light propagated in the core 7 by 90 degrees to cause the light to enter a light-receiving portion of an optical element or to change the direction of light exiting from a light-emitting portion of an optical element by 90 degrees to cause the light to enter the core 7.

Figure 8A:
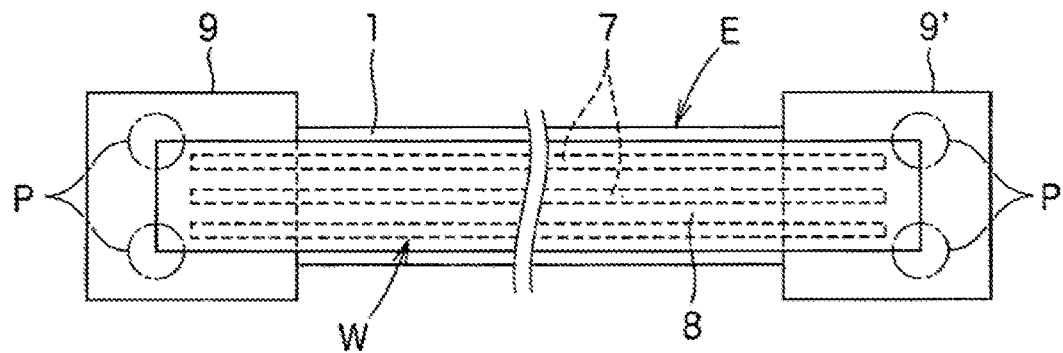
FIGS. 8A and 8B are illustrations for illustrating problems of a conventional opto-electric hybrid board.
Figure 8B:
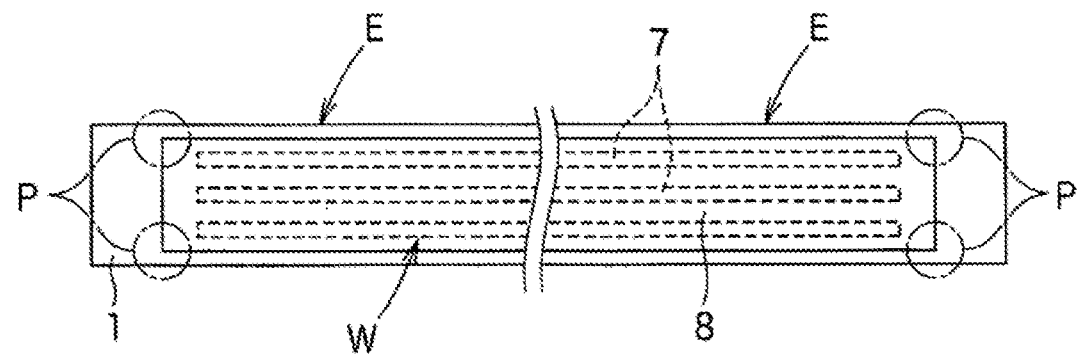

A metal layer 9 for reinforcing the opto-electric hybrid board 10 is provided between the electric circuit board E and the optical waveguide W. The metal layer 9 is patterned in opposite end portions (with reference to FIG. 8A) other than an intermediate portion where flexibility is required. The metal layer 9 is provided with a through hole 5 for ensuring an optical path between the core 7 and the optical element. The under cladding layer 6 extends into the through hole 5. In FIG. 1B, the through hole 5 is not shown, and an area where the metal layer 9 is formed is shaded by means of widely spaced diagonal lines extending from bottom left to top right.

As shown in FIG. 1B, the optical waveguide W provided on the back surface of the electric circuit board E has left-hand and right-hand end portions each disposed in overlapping relation with the metal layer 9 and each including two corner portions P radiused to have the shape of a quadrant arc. This is a striking feature of the present disclosure. It should be noted that the right-hand portion of the opto-electric hybrid board 10 is identical in structure with the left-hand portion thereof shown in the FIG. except that the right-hand portion is a mirror image of the left-hand portion, and hence will not be described and shown.

Next, a method of manufacturing the opto-electric hybrid board 10 will be described (with reference to FIGS. 2A to 2D and FIGS. 3A to 3D).

First, the metal layer 9 of a planar configuration is prepared. A photosensitive insulating resin including polyimide and the like is applied to the front surface of the metal layer 9 to form the insulation layer 1 having a predetermined pattern by a photolithographic process (with reference to FIG. 2A). The insulation layer 1 has a thickness in the range of 3 to 50 μm, for example. Examples of a material for the formation of the metal layer 9 include stainless steely copper, silver, aluminum, nickel, chromium, titanium, platinum and gold. In particular, stainless steel is preferable from the viewpoint of rigidity and the like. Although the thickness depends on the material of the metal layer 9, the thickness of the metal layer 9 is in the range of 10 to 70 μm, for example, when stainless steel is used. When the thickness of the metal layer 9 is less than 10 μm, there is apprehension that a sufficient reinforcing effect is not provided. When the thickness of the metal layer 9 is greater than 70 μm, there is apprehension that an increase in the distance that light travels in the through hole 5 of the metal layer 9 results in an increase in optical losses.

Figure 2A:
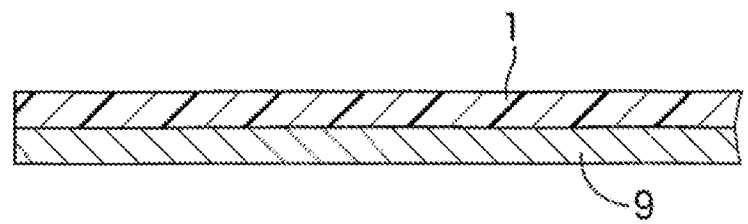
FIGS. 2A to 2D are illustrations showing j the steps of producing an electric circuit board in a method of manufacturing an opto-electric hybrid board.
Figure 2B:
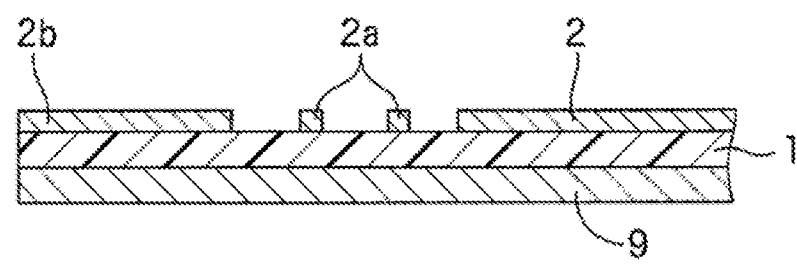

Next, as shown in FIG. 2B, the electrical interconnect lines 2 (including the optical element mounting pads 2a, the connector mounting pad 2b, other pads, grounding electrodes and the like; the same shall apply hereinafter) are formed on the front surface of the insulation layer 1 by a semi-additive process, for example. This process is as follows. First, a metal film (not shown) made of copper, chromium and the like is formed on the front surface of the insulation layer 1 by sputtering, electroless plating or the like. This metal layer serves as a seed layer (a layer serving as a basis material for the formation of an electroplated layer) for a subsequent electroplating process. Then, a photosensitive resist (not shown) is laminated to the opposite surfaces of a laminate comprised of the metal layer 9, the insulation layer 1 and the seed layer. Thereafter, a photolithographic process is performed to form holes having the pattern of the electrical interconnect lines 2 in the photosensitive resist on the side where the seed layer is formed, so that surface portions of the seed layer are uncovered at the bottoms of the holes. Next, electroplating is performed to form an electroplated layer made of copper and the like in a stacked manner on the surface portions of the seed layer uncovered at the bottoms of the holes. Then, the photosensitive resist is stripped away using an aqueous sodium hydroxide solution and the like. Thereafter, a portion of the seed layer on which the electroplated layer is not formed is removed by soft etching. Laminate portions comprised of the remaining seed layer and the electroplated layer become the electrical interconnect lines 2.

Figure 2C:
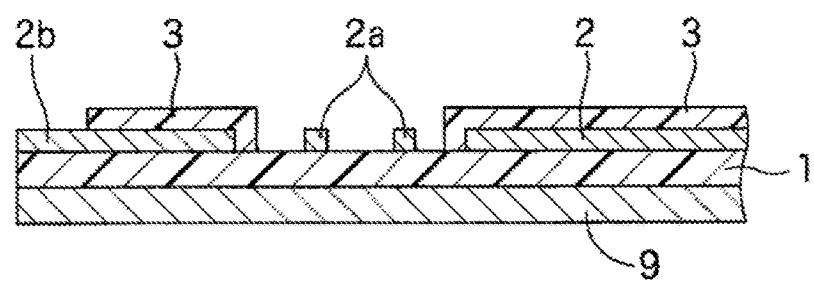

Next, as shown in FIG. 2C, a photosensitive insulating resin including polyimide and the like is applied to portions of the electrical interconnect lines 2 other than the optical element mounting pads 2a, part of the connector mounting pad 2b and the like to form the coverlay 3 by a photolithographic process.

Figure 2D:
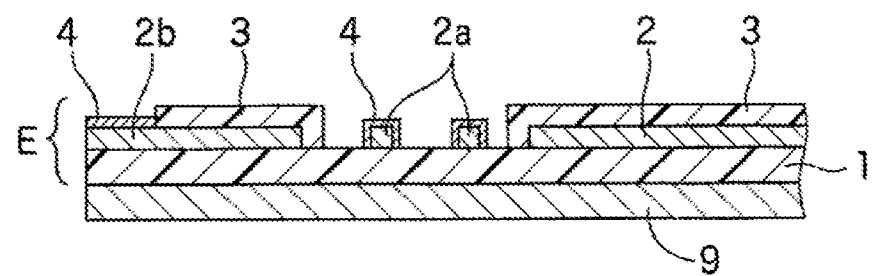

Then, as shown in FIG. 2D, the electroplated layer 4 is formed on the front surfaces of the optical element mounting pads 2a, the part of the connector mounting pad 2b and the like which are not covered with the coverlay 3. In this manner, the electric circuit board E is formed.

Next, a photosensitive resist is laminated to the opposite surfaces of a laminate comprised of the metal layer 9 and the electric circuit board E. Thereafter, holes are formed by a photolithographic process in portions of the photosensitive resist on the back surface (the surface opposite from the electric circuit board E) of the metal layer 9 which correspond to a portion not requiring the metal layer 9 and a future through hole portion for the optical path, so that the back surface of the metal layer 9 is partially uncovered.

Then, the uncovered portions of the metal layer 9 are removed by etching using an aqueous etching solution for the metal material of the metal layer 9 (for example, an aqueous ferric chloride solution is used as the aqueous etching solution when the metal layer 9 is a stainless steel layer), so that the insulation layer 1, is uncovered in the sites where the metal layer 9 is removed. Thereafter, the photosensitive resist is stripped away using an aqueous sodium hydroxide solution and the like. Thus, as shown, in FIG. 3A, the metal layer 9 is formed only in a region where the reinforcement is required, and the through hole 5 for the optical path is formed at the same time.

Figure 3A:
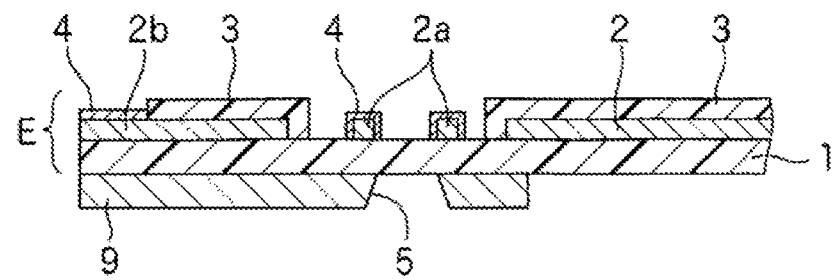
FIGS. 3A to 3D are illustrations showing the steps of producing an optical waveguide in the method of manufacturing the opto-electric hybrid board.
Figure 3B:
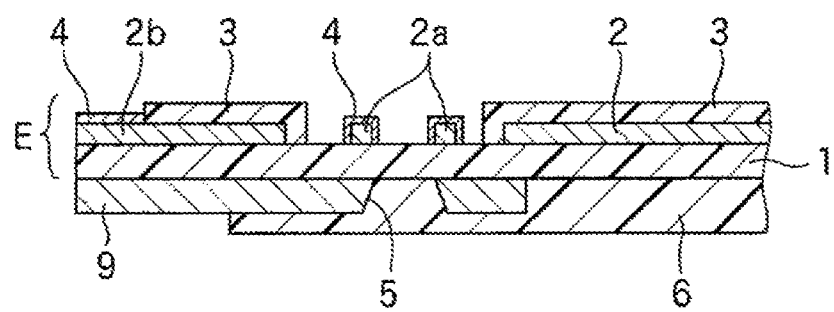

For the formation of the optical waveguide W (with reference to FIG. 1A) on the back surface of the insulation layer 1 (back surface of the metal layer 9 in the portion where the metal layer 9 is formed), a photosensitive resin that is the material for the formation of the under cladding layer 6 is applied to the back surfaces (the lower surfaces as seen in the figure) of the insulation layer 1 and the metal layer 9, as shown in FIG. 3B. Thereafter, the applied layer is exposed to irradiation light. This exposure cures the applied layer to form the under cladding layer 6. The under cladding layer 6 is formed into a predetermined pattern including the radiused corner portions P (with reference to FIG. 1B) provided in the end portions thereof by a photolithographic process. The under cladding layer 6 fills the through hole 5 for the optical path in the metal layer 9. The under cladding layer 6 has a thickness (thickness as measured from the back surface of the insulation layer 1) generally greater than the thickness of the metal layer 9. A series of operations for the formation of the optical waveguide W are performed while the back surface of the insulation layer 1 on which the metal layer 9 is formed is oriented upward. However, the orientation is shown unchanged in the figure.

Figure 3C:
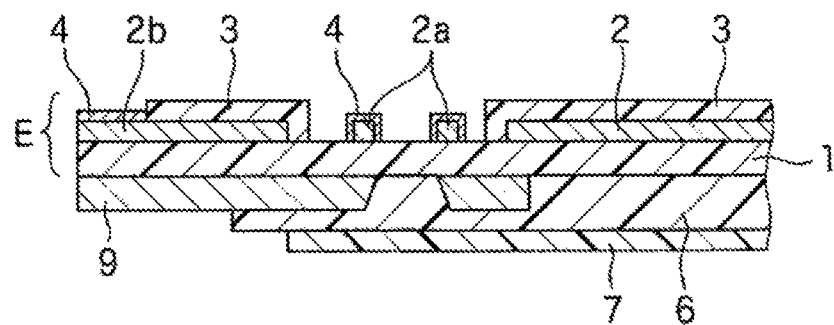

Next, as shown in FIG. 3C, the core 7 having a predetermined pattern is formed on the front surface (the lower surface as seen in the FIG.) of the under cladding layer 6 by a photolithographic process. The core 7 has a thickness in the range of 3 to 100 μm, for example, and a width in the range of 3 to 100 μm, for example. An example of the material for the formation of the core 7 includes a photosensitive resin similar to that for the under cladding layer 6, and the material used herein has a refractive index higher than that of the material for the formation of the under cladding layer 6 and the over cladding layer 8 to be described below. The adjustment of the refractive indices may be made, for example, by adjusting the selection of the types of the materials for the formation of the under cladding layer 6, the core 7 and the over cladding layer 8, and the composition ratio thereof.

Figure 3D:
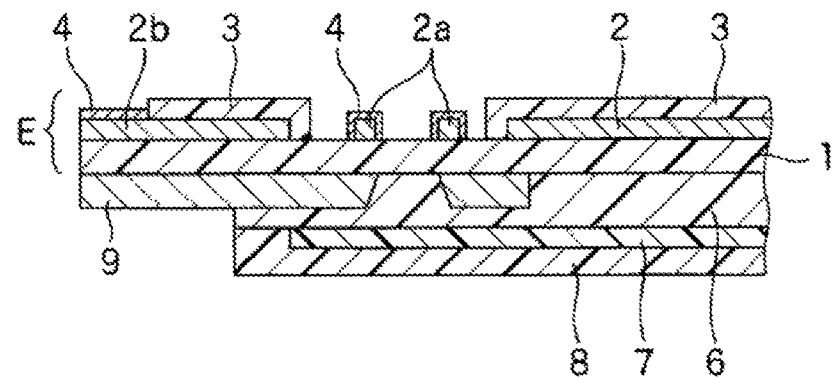

Next, as shown in FIG. 3D, the over cladding layer 8 is formed on the front surface (the lower surface as seen in the FIG.) of the under cladding layer 6 by a photolithographic process so as to cover the core 7. The over cladding layer 8 is also shaped in a predetermined pattern including the radiused corner portions P (with reference to FIG. 1B) provided in the end portions thereof in conformity with the shape of the under cladding layer 6. In this manner, the optical waveguide W is formed. The over cladding layer 8 has a thickness (thickness as measured from the front surface of the under cladding layer 6) not less than that of the core 7 and not greater than 300 μm, for example. An example of the material for the formation of the over cladding layer 8 includes a photosensitive resin similar to that for the under cladding layer 6.

Specific composition examples of the materials for the formation of the optical waveguide W are as follows.

<Materials for Formation of Under Cladding Layer 6 and Over Cladding Layer 8>

20 parts by weight of an epoxy resin containing an alicyclic skeleton (EHPE 3150 available from Daicel Chemical Industries, Ltd.)

80 parts by weight of a liquid long-chain bifunctional semi-aliphatic epoxy resin (EXA-4816 available from DIG Corporation)

2 parts by weight of a photo-acid generator (SP170 available from ADEKA Corporation)

40 parts by weight of ethyl lactate, (available from Musashino Chemical Laboratory, Ltd.)

<Material for Formation of Core 7>

50 parts by weight of o-cresol novolac glycidyl ether (YDCM-700-10 available from Nippon Steel & Sumikin Chemical Co., Ltd.)

50 parts by weight of bisphenoxyethanolfluorene diglycidyl ether (OGSOL EG available from Osaka Gas Chemicals Co., Ltd.)

1 part by weight of a photo-acid generator (SP170 available from ADEKA Corporation)

50 parts by weight of ethyl lactate (available from Musashino Chemical Laboratory, Ltd.)

An inclined surface inclined at 45 degrees with respect to the direction in which the core 7 extends is formed in a predetermined portion of the optical waveguide W by laser beam machining, cutting and the like to provide the reflecting surface 7a (with reference to FIG. 1A) for optical coupling to the optical element to be mounted on the front surface of the electric circuit board E. Then, necessary members are mounted, for example, by mounting the optical element on the pads 2a of the electrical interconnect lines 2 provided on the front surface of the electric circuit board E.

In this manner, the opto-electric hybrid board 10 shown in FIGS. 1A and 1B is provided. In the opto-electric hybrid board 10, the optical waveguide W disposed in overlapping relation with the metal layer 9 on the back surface of the electric circuit board E includes the radiused corner portions P provided in the end portions thereof. If the metal layer 9 and the optical waveguide W differ from each other in internal stresses generated by external loads or heat in the laminate portion comprised of the metal layer 9 and the optical waveguide W, the aforementioned configuration prevents warpage and distortions caused by the difference in stresses from being concentrated in the corner portions P to disperse such warpage and distortions along the arcuate outlines of the radiused portions. Thus, the optical waveguide W does not peel off in its end portions in the manufacturing steps including mounting the optical element and the like, in the step of incorporating the opto-electric hybrid board 10 into an electronic device and during the actual use thereof. This allows the opto-electric hybrid board 10 to be used favorably over a prolonged period.

The process of radiusing the corner portions P provided in the end portions of the optical waveguide W during the formation of the optical waveguide W in the opto-electric hybrid board 10 does not require any special step but is easily attained only by using a photomask configured to radius the end portions. This is advantageous in high manufacturing efficiency.

In the case of radiusing the corner portions P provided in the end portions of the optical waveguide W, the radius of curvature (designated by R in FIG. 1B) thereof is preferably in the range of 0.1 to 10.0 mm, and more preferably in the range of 0.5 to 5.0 mm. When the radius of curvature R is less than the aforementioned range, there is apprehension that the effect of preventing the optical waveguide W from peeling off is not sufficiently produced. When the radius of curvature R is greater than the aforementioned range, there is apprehension that the arrangement of the core 7, the width of the optical waveguide W and the like are subject to the influence thereof.

Figure 4:
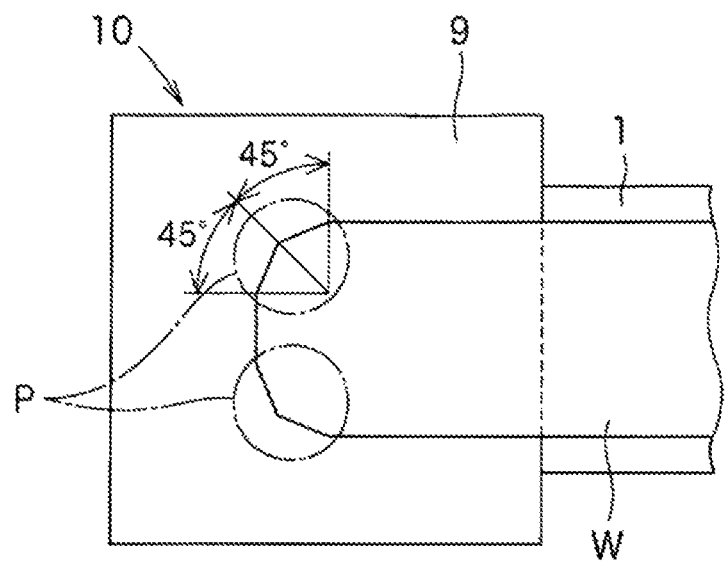
FIG. 4 is an illustration of a modification of the shape of corner portions in the aforementioned example.

In the aforementioned instance, the corner portions P provided in the end portions of the optical waveguide W are radiused to have the shape of an arc, whereby the concentration of stresses in the corner portions P is avoided so that the optical waveguide W is prevented from peeling off. However, the shape of the corner portions P is not limited to this. For example, as shown in FIG. 4, the corner portions P may be in a polygonal shape produced by arranging a plurality of obtuse-angled portions in a substantially arcuate configuration. When a polygonal shape is used, it is desirable that this polygonal shape is the shape of part of a regular polygon, and it is preferable that the obtuse-angled portions are arranged equally with respect to the original corner portions. If the obtuse-angled portions are arranged irregularly, an external force, if applied, causes the stresses to be concentrated in only a specific one of the obtuse-angled portions, which in turn results in apprehension that peeling off starts in that portion. In this figure, each of the corner portions P of the optical waveguide W is replaced with a quarter configuration of a regular octagon produced by combining eight isosceles triangles each having a vertex angle of 45 degrees.

Figure 5:
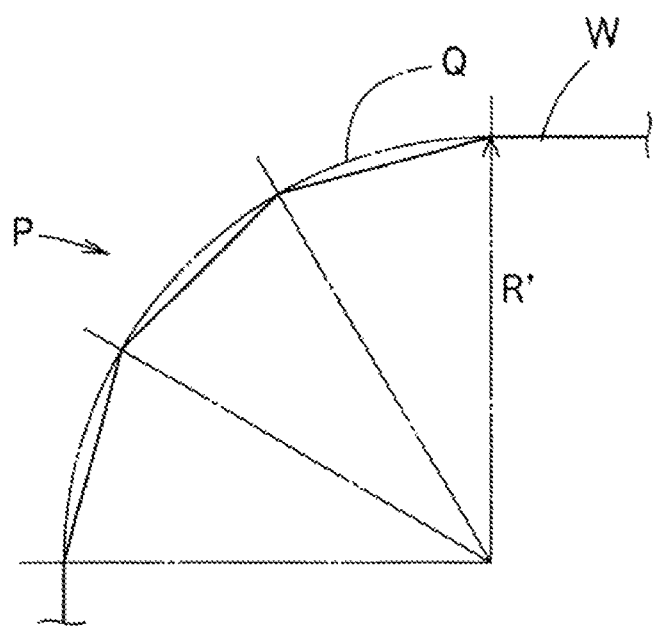
FIG. 5 is an illustration of a preferable shape in the aforementioned modification.

As shown in FIG. 5, when each of the corner portions P provided in the end portions of the optical waveguide W is in a substantially arcuate shape produced by a combination of obtuse-angled portions, it is preferable that the polygonal shape is part of a regular polygon (in this figure, a quarter configuration of a regular dodecagon). In addition, the radius of curvature (designated by R' in FIG. 5) of an arc formed by the circumcircle Q of the regular polygon is preferably in the range of 0.1 to 10.0 mm, and sore preferably in the range of 0.5 to 5.0 mm. Also in this case, when the radius of curvature R' is less than the aforementioned range, there is apprehension that the effect of preventing the optical waveguide W from peeling off is not sufficiently produced. When the radius of curvature R' is greater than the aforementioned range, there is apprehension that the arrangement of the core 7, the width of the optical waveguide W and the like are subject to the influence thereof.

Figure 6A:
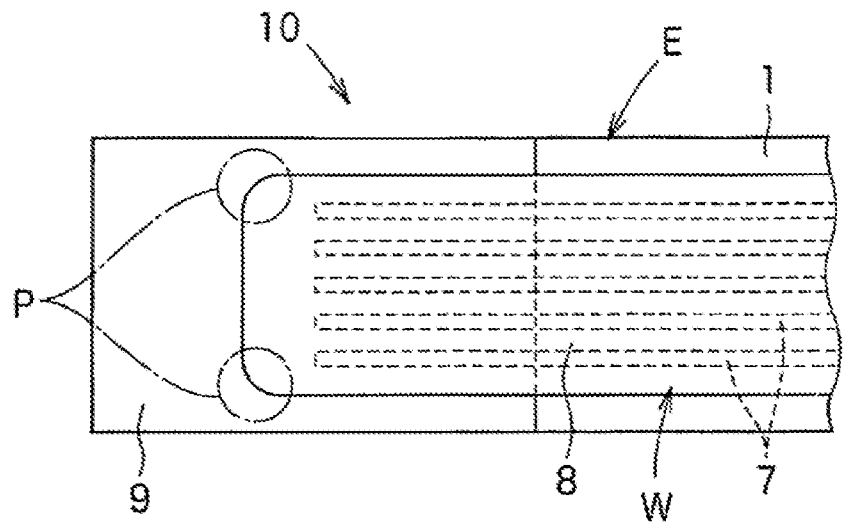
FIGS. 6A and 6B are illustrations showing other embodiments of the present disclosure.

In the aforementioned instance, the end portions of the optical waveguide W are disposed in overlapping relation with the metal layer 9 having an increased width in the opposite end portions of the opto-electric hybrid board 10. However, the present disclosure is applicable to the opto-electric hybrid board 10 of a strip-shaped configuration entirely having the same width, as shown in FIG. 6A. In this case, each of the corner portions P provided in the end portions of the optical waveguide W which overlap the metal layer 9 is also made into a substantially arcuate shape produced by a combination of obtuse-angled portions, whereby the effect of preventing the optical waveguide W from peeling off is also produced.

Figure 6B:
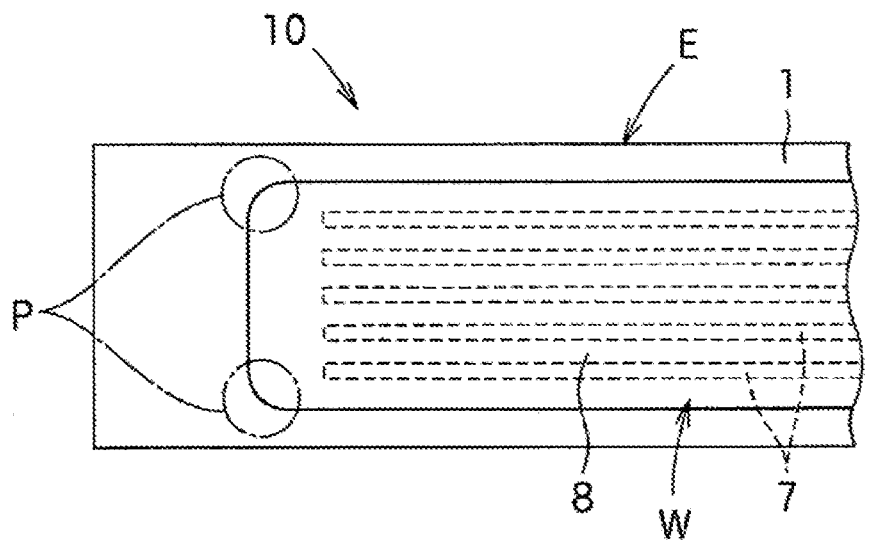
Figure 7:
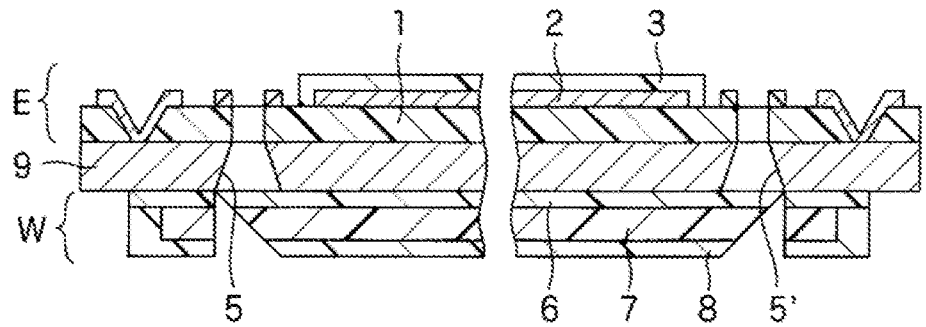
FIG. 7 is a schematic vertical sectional view of an example of a conventional opto-electric hybrid board.

The present disclosure is also applicable to the opto-electric hybrid board 10 in which the metal layer is not provided on the back surface, of the electric circuit board E and in which the optical waveguide W is directly overlaid on the back surface of the insulation layer 1, as shown in FIG. 6B. The insulation layer 1 and the optical waveguide W are made of different materials although the two types of resins are joined together in the laminate portion comprised of the insulation layer 1 and the optical waveguide W. Thus, warpage and distortions are prone to occur in the optical waveguide W due to the difference in stresses between the insulation layer 1 and the optical waveguide W. To prevent this, each of the corner portions P where the stresses are prone to be concentrated in the optical waveguide W is radiused or made into a substantially arcuate shape produced by a combination of obtuse-angled portions as in the aforementioned instance, whereby the effect of preventing the optical waveguide W from peeling off is effectively produced.

In the aforementioned instance, the opto-electric hybrid board 10 has a bilaterally symmetric structure in which opto-electric coupling portions are provided in both left-hand and right-hand end portions thereof. However, an opto-electric coupling portion may be provided in one end portion, whereas the other end portion serves merely as a portion for connection to a connector. In such a case, it is preferable that the configuration of the present disclosure is applied to an end portion of the optical waveguide W which is used for opto-electric coupling.

Also, in the aforementioned instance, the outside shape of the optical waveguide W is defined by both the under cladding layer 6 and the over cladding layer 8. However, the outside shape of the optical waveguide W may be defined by only the over cladding layer S or the core 7.

Although specific forms in the present disclosure have been described in the aforementioned embodiments, the aforementioned embodiments should be considered as merely illustrative and not restrictive. It is contemplated that various modifications evident to those skilled in the art could be made without departing from the scope of the present disclosure.

The present disclosure is applicable to an excellent opto-electric hybrid board which is used with security over a prolonged period because an optical waveguide is less prone to peel off the back surface of an electric circuit board portion.

REFERENCE SIGNS LIST

E Electric circuit board
W Optical waveguide
P Corner portions
1 Insulation layer
2 Electrical interconnect lines
9 Metal layer
10 Opto-electric hybrid board

The invention claimed is:

1. An opto-electric hybrid board, comprising:
an electric circuit board including an insulation layer, and an electrical interconnect line formed on a front surface of the insulation layer; and
an optical waveguide,
wherein the optical waveguide has a rectangular shape as seen in plan view and is provided on a side of the electric circuit board opposite to the electrical interconnect line, relative to the insulation layer having the electrical interconnect line provided on the front surface thereof;
wherein the optical waveguide has at least one end portion disposed in overlapping relation with the insulation layer of the electric circuit board;
wherein the at least one end portion of the optical waveguide has a corner portion, the corner portion having a polygonal shape including part of a regular polygon produced by arranging a plurality of obtuse-angled portions in an arcuate configuration; and
wherein a radius of curvature of an arc circumscribed about the polygonal shape is in a range of 0.1 to 10.0 mm.

2. An opto-electric hybrid board, comprising:
an electric circuit board including an insulation layer, and an electrical interconnect line formed on a front surface of the insulation layer; and
an optical waveguide,
wherein the optical waveguide has a rectangular shape as seen in plan view and is provided on a side of the electric circuit board opposite to the electrical interconnect line, relative to the insulation layer having the electrical interconnect line provided on the front surface thereof;
wherein the optical waveguide has at least one end portion disposed in overlapping relation with the insulation layer of the electric circuit board;
wherein the at least one end portion of the optical waveguide has a corner portion, the corner portion being radiused to have an arcuate shape; and
wherein a radius of curvature of the arcuate shape of the radiused corner is in a range of 0.1 to 10.0 mm.

3. The opto-electric hybrid board according to claim 1, wherein a metal layer is interposed between the insulation layer and the optical waveguide.

4. The opto-electric hybrid board according to claim 2, wherein a metal layer is interposed between the insulation layer and the optical waveguide.

* * * * *